United States Patent
Wang

(10) Patent No.: US 10,212,830 B2
(45) Date of Patent: Feb. 19, 2019

(54) FOLDABLE DISPLAY DEVICE

(71) Applicant: BOE TECHNOLOGY GROUP CO., LTD., Beijing (CN)

(72) Inventor: Wenbo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/511,458

(22) PCT Filed: Sep. 18, 2015

(86) PCT No.: PCT/CN2015/089945
§ 371 (c)(1),
(2) Date: Mar. 15, 2017

(87) PCT Pub. No.: WO2016/206197
PCT Pub. Date: Dec. 29, 2016

(65) Prior Publication Data
US 2017/0290177 A1    Oct. 5, 2017

(30) Foreign Application Priority Data

Jun. 25, 2015 (CN) .......................... 2015 1 0359444

(51) Int. Cl.
| | | |
|---|---|---|
| *H05K 7/00* | (2006.01) | |
| *H05K 5/00* | (2006.01) | |
| *H01L 51/52* | (2006.01) | |
| *H05K 5/02* | (2006.01) | |

(Continued)

(52) U.S. Cl.
CPC ..... *H05K 5/0017* (2013.01); *G02F 1/133305* (2013.01); *H01L 51/5237* (2013.01);
(Continued)

(58) Field of Classification Search
CPC ....................................................... H05K 7/00
(Continued)

(56) References Cited

U.S. PATENT DOCUMENTS

2007/0069975 A1    3/2007 Gettemy et al.
2012/0002360 A1*   1/2012 Seo .................... G06F 1/1616
                                                    361/679.01
(Continued)

FOREIGN PATENT DOCUMENTS

CN    201733537 U    2/2011
CN    103149979 A    6/2013
(Continued)

OTHER PUBLICATIONS

Written Opinion of the International Searching Authority from PCT Application No. PCT/CN2015/089945, dated Feb. 25, 2016 (4 pages).
(Continued)

*Primary Examiner* — Jerry Wu
(74) *Attorney, Agent, or Firm* — Harness, Dickey & Pierce, P.L.C.

(57) ABSTRACT

An embodiment of the present invention provides a foldable display device comprising a foldable housing and a flexible display screen, the flexible display screen having a first end and a second end disposed opposite to each other in a first direction, wherein the first end of the flexible display screen is secured to the foldable housing, the second end of the flexible display screen is removable relative to the foldable housing; and when the foldable display device is in a folded state, the flexible display screen is located on a side of the foldable opposite to the folded surface of the foldable housing. The present invention can solve the problem that the radius of curvature of the folded portion of the flexible display screen is too small when the display device is folded, so that the flexible display screen can be prevented from being damaged.

13 Claims, 4 Drawing Sheets

(51) Int. Cl.
*G02F 1/1333* (2006.01)
*G09F 9/30* (2006.01)

(52) U.S. Cl.
CPC ......... *H05K 5/0013* (2013.01); *H05K 5/0217* (2013.01); *G09F 9/301* (2013.01); *H01L 2251/5338* (2013.01)

(58) Field of Classification Search
USPC .................................................. 361/679.01
See application file for complete search history.

(56) References Cited

U.S. PATENT DOCUMENTS

| 2012/0314399 A1 | 12/2012 | Bohn et al. |
| 2014/0029171 A1 | 1/2014 | Lee |
| 2014/0213324 A1 | 7/2014 | Tan et al. |

FOREIGN PATENT DOCUMENTS

| CN | 103582340 A | 2/2014 |
| CN | 104200753 A | 12/2014 |
| CN | 104680940 A | 6/2015 |
| CN | 104916231 A | 9/2015 |
| EP | 2403222 A1 | 1/2012 |
| WO | WO-2008083361 A1 | 7/2008 |

OTHER PUBLICATIONS

Office Action from corresponding Chinese Application No. 201510359444.9, dated Jan. 24, 2017 (6 pages).

\* cited by examiner

FOLDABLE DISPLAY DEVICE

TECHNICAL FIELD

Embodiments of the present invention relate to a foldable display device.

BACKGROUND

In recent years, with the development of display technology, portable terminals such as mobile phones and tablet computers are extremely popular. However, as portable terminals such as mobile phones and tablet computers have increased in size, these terminal devices are not easy to carry.

A foldable display device can solve the problem that it is not easy to carry. The display screen included in the foldable display device is a flexible display screen. However, when the foldable display device is folded, the radius of curvature of the folded portion of the flexible display screen may be close to the critical radius of curvature of the flexible display screen, or even less than the critical radius of curvature of the flexible display screen, and thus the display may be broken.

SUMMARY OF THE INVENTION

An embodiment of the present invention provides a foldable display device which can solve the problem that the folded portion of the flexible display screen is too small in the radius of curvature of the flexible display screen when the display device is folded so that the flexible display screen can be prevented from being damaged.

In order to achieve the above-mentioned object, embodiments of the present invention adopt the following technical solutions:

There is provided a foldable display device comprising a foldable housing and a flexible display screen having a first end and a second end disposed opposite to each other in a first direction; wherein the first end of the flexible display screen is secured to the foldable housing, the second end of the flexible display screen is removable with respect to the foldable housing; the flexible display screen is located on a side of the foldable housing opposite to a folded surface when the foldable display device is in a folded state. Herein, the folded surface means the surface of the foldable housing on the folded side, that is, the side surface where the halves located on both sides of the fold line come close to each other during the folding process.

In an embodiment of the present invention, the foldable housing is provided with a first fixing part for fixing the second end of the flexible display screen when the foldable display device is in an unfolded state.

In an embodiment of the present invention, the flexible display screen is moved toward an outer side of the foldable display device so as to be located on the side of foldable housing opposite to the folded surface when the foldable display device in the unfolded state is folded inward.

In an embodiment of the present invention, the first end of the flexible display screen is secured to the foldable housing by an elastic member.

In a further embodiment of the present invention, the elastic member comprises a spring, or a rubber band.

In an embodiment of the present invention, the foldable display device further comprises a second fixing part for securing the second end of the flexible display screen after folding of the foldable display device.

In a further embodiment of the invention, the foldable display device further comprises a foldable outer frame, a cavity that is configured to accommodate the flexible display screen after the foldable display device is folded; wherein the cavity is disposed between the foldable outer frame and the foldable housing; wherein the cavity is disposed adjacent to the outer surface of the foldable housing after folding of the foldable display device.

In a further embodiment of the present invention, the second fixing part is provided inside the cavity.

In a further embodiment of the present invention, the second fixing part is two elastic protrusions disposed opposite to each other in the cavity.

In a further embodiment of the present invention, the foldable outer frame is made of a transparent material so that the flexible display screen can still display after folding of the foldable display device.

In an embodiment of the present invention, at least a side surface of the two side surfaces disposed opposite to each other in the first direction of the foldable housing adjacent to the first fixing part is an arcuate surface.

In a further embodiment of the present invention, the folded portion of the foldable housing after folding of the foldable display device has an arcuate surface.

In an embodiment of the present invention, the first fixing part includes two blocking portions and an opening and closing portion; one end of each blocking portion is connected to the foldable housing, and the other end thereof is connected to the opening and closing portion, and the opening/closing portion is movable relative to the blocking portion.

In an embodiment of the present invention, the foldable display device further comprises a circuit board disposed on the foldable housing adjacent to the first end of the flexible display screen.

An embodiment of the present invention provides a foldable display device comprising a foldable housing, and a flexible display screen having a first end and a second end disposed opposite to each other in a first direction; wherein the first end of the flexible display screen is secured to the foldable housing; the second end of the flexible display screen is removable relative to the foldable housing. The foldable housing is provided with a first fixing part for fixing the second end of the flexible display screen when the foldable display device is in an unfolded state; the flexible display screen is located on a side of the foldable housing opposite to the folded surface when the foldable display device is in a folded state.

Since the flexible display screen is on the outer side of the foldable housing when the foldable display device is in a folded state, i.e. a folded portion of the flexible display screen being supported by a folded portion of the foldable housing, the radius of curvature of the folded portion of the flexible display screen is not too small so that the flexible display screen can be prevented from being damaged.

BRIEF DESCRIPTION OF THE DRAWINGS

In order to more clearly illustrate the technical solutions of embodiments of the present invention or the prior art, the drawings which are required to be used in the embodiments or the prior art description will be briefly described below, and it will be apparent that the drawings in the following description only represent some embodiments of the present invention, and it is to be understood that other embodiments of the present invention may be made by those skilled in the art based on these drawings without paying creative effort.

DETAILED DESCRIPTION

Embodiments of the invention will now be described, by way of example only, with reference to the accompanying drawings. Apparently the described embodiments are only some of and not all the embodiments of the present invention. All other embodiments obtained by those skilled in the art based on the embodiments of the present invention without making creative work are within the scope of the protection of the present invention.

Figure 1:
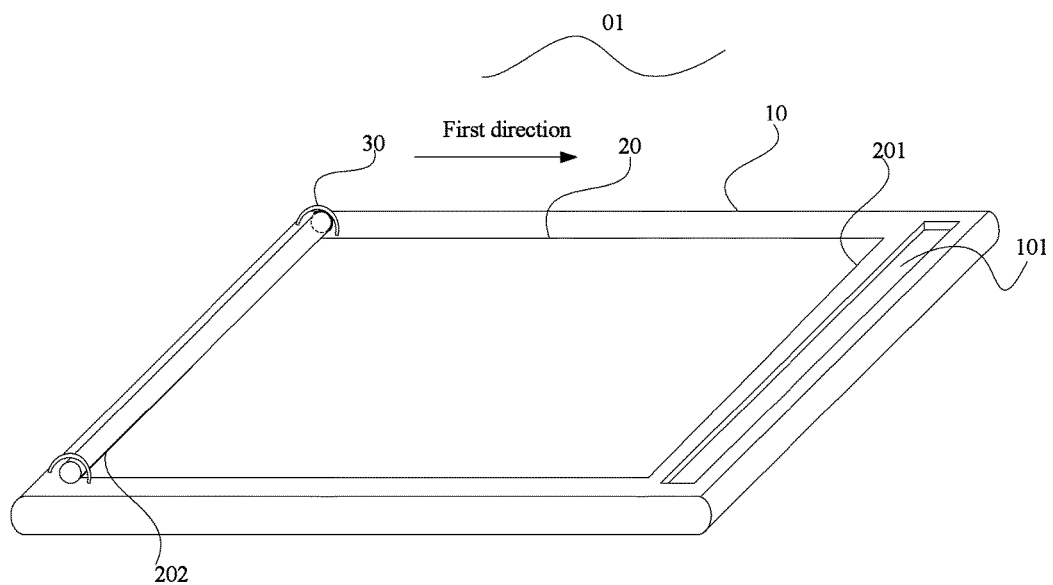
FIG. 1 is a schematic structural view of a foldable display device in an unfolded state according to an embodiment of the present invention.
Figure 2:
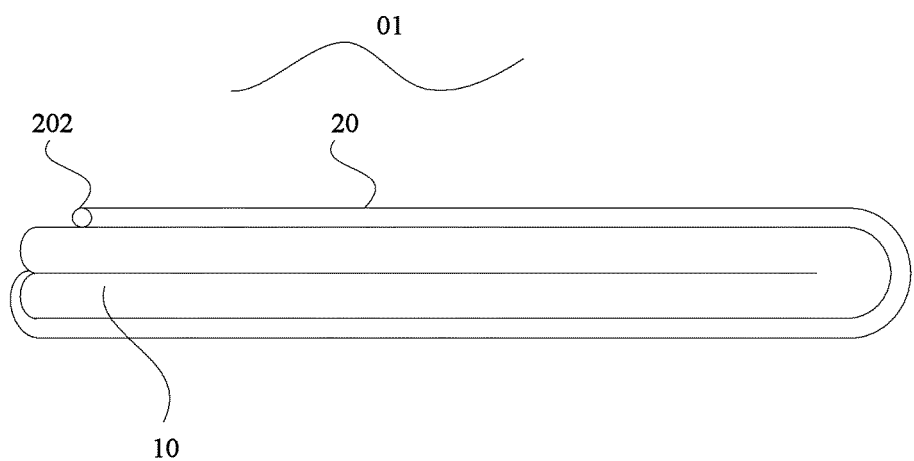
FIG. 2 is a schematic structural view of a foldable display device in a folded state according to an embodiment of the present invention.

As shown in FIGS. 1 to 2, an embodiment of the present invention provides a foldable display device 01 comprising a foldable housing 10 and a flexible display screen 20, a first end 201 of the flexible display screen 20 and a second end 202 are disposed opposite to each other in a first direction.

The first end 201 of the flexible display screen 20 is secured to the foldable housing 10; the second end 202 of the flexible display screen 20 is removable with respect to the foldable housing 10 and the foldable housing 10 is provided with a first fixing part 30 for fixing the second end 202 of the flexible display screen 20 when the foldable display device 01 is in an unfolded state. The flexible display screen 20 is located on the side of the foldable housing 10 opposite to the folded surface when the foldable display device 01 is in a folded state. Here, the folded surface means the surface on the folded side of the foldable housing 10, that is, the side surface where the halves located on both sides of the fold line come close to each other during the folding process.

It is to be noted that, firstly, the material and the structure of the foldable housing 10 are not limited as long as they can be freely folded and unfolded.

Secondly, the manner in which the first end 201 of the flexible display screen 20 and the foldable housing 10 are secured are not limited.

Thirdly, the first fixing part 30 is not limited, as long as the second end 202 of the flexible display screen 20 can be secured when the foldable display device 01 is in the unfolded state, and the second end 202 can be disengaged therefrom when the foldable display device 01 is folded inward.

On the other hand, since the first fixing part 30 protrudes from the surface of the foldable housing 10, when the foldable display device 01 is folded inward, the first fixing part 30 may cause that the folded surface of the foldable housing 10 cannot conform well. Therefore, an embodiment of the present invention may optionally provide on the other side of the foldable housing 10 opposite to the first fixing part 30 a recess 101 that can accommodate the first fixing part 30, so as to allow the first fixing part 30 to be fitted into the recess 101 when the foldable display device 01 is folded inward, so that folded surface of the foldable housing 10 may fully conform as shown in FIG. 2.

It should be understood by those skilled in the art that since it is a display device, it must be ensured that it can be display when the foldable display device 01 is in an unfolded state. Based on this, when the foldable display device 01 is in the unfolded state, the flexible display screen 20 is placed flat on the surface of the foldable housing 10, so that the first fixing part 30 should be in a position just to unfold the flexible display screen 10.

Here, the surface of the foldable housing 10 in contact with the flexible display screen 20 is a reference surface, and when folded, if the reference surface is located inside the foldable housing 10, it is folded inward and the reference surface is the folded surface, in which case, the flexible display screen 20 is located on the side of the foldable housing 10 opposite to the reference surface; when folded, if the reference surface is located outside the foldable housing 10, it is folded outwardly, in which case, the surface of the foldable housing 10 opposite to the reference surface is the folded surface, and the flexible display screen 20 is located on the side of the reference surface.

Fourthly, since embodiments of the present invention solve the problem that the radius of curvature of the folded portion of the flexible display screen 20 is too small when the folded display device 01 is folded, it is necessary to ensure that after folding of the foldable display device 01, the flexible display screen 20 is not in the inside of the folded display device.

An embodiment of the present invention provides a foldable display device 01 comprising a foldable housing 10 and a flexible display screen 20 having a first end 201 and a second end 202 disposed opposite to each other in a first direction, wherein a first end 201 of the flexible display screen 20 is secured to the foldable housing 10; a second end 202 of the flexible display screen 20 is removable with respect to the foldable housing 10, and the foldable housing 10 is provided with a first fixing part 30 for fixing the second end 202 of the flexible display screen 20 when the foldable display device 01 is in an unfolded state; when the foldable display device 01 is in a folded state, the flexible display screen 20 is located on a side of the foldable housing 10 opposite to the folded surface.

Since the flexible display screen 20 is on the outer side of the foldable display device 01 when the foldable display device 01 is in the folded state, i.e., a folded portion of the foldable display screen 20 being supported by a folded portion of the foldable housing 10, the radius of curvature of the folded portion of the flexible display screen 20 is not too small and the flexible display screen 20 can be prevented from being damaged.

Figure 3:
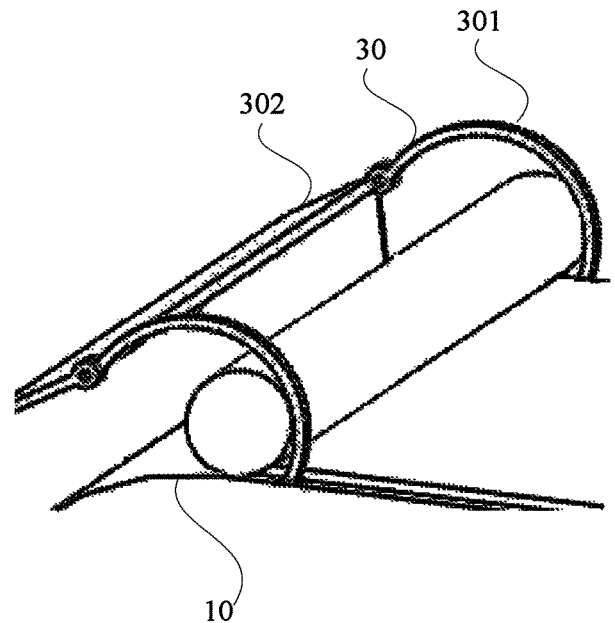
FIG. 3 is a schematic structural view of a first fixing part according to an embodiment of the present invention.

Optionally, as shown in FIG. 3, the first fixing part 30 includes two blocking portions 301 and an opening/closing portion 302; one end of each blocking portion 301 is connected to the foldable housing 10, and the other end thereof is connected to the opening/closing portion 302, and the opening/closing portion 302 is movable relative to the blocking portions 301.

Here, since the two blocking portions 301 of the first fixing part 30 cannot block the drawing out of the flexible display screen 20 when the foldable display device 01 is unfolded, it will be appreciated by those skilled in the art that the distance between the two blocking portions 301 should be slightly larger than the flexible display screen 30 in the distance direction. At the same time, since the two blocking portions 301 are also used to fix the second end 202 of the flexible display screen 20 when the foldable display device 01 is in the unfolded state, the second end 202 should be slightly larger than the distance between the two blocking portions 301.

The present invention may be implemented by providing a pillar, slightly longer than the flexible display screen 20, at the edge of the flexible display screen 20 as its second end 202.

In this way, when the foldable display device 01 in the unfolded state is folded inward, the opening and closing portion 302 can be controlled to be opened so that the second end 202 of the flexible display screen 20 comes out from the first fixing part 30, and moves the entire flexible display screen 20 to the outer side of the foldable display device 01. When the foldable display device 01 in the folded state is unfolded and the second end 202 enters the first fixing part 30, the opening/closing portion 302 may be controlled to be closed, and the second end can be fixed in the first fixing part 30 due to the blockage of the blocking portions 301 and the closed opening/closing portion 302.

Optionally, the first end 201 of the flexible display screen 20 is secured to the foldable housing 10 by an elastic member.

Figure 4:
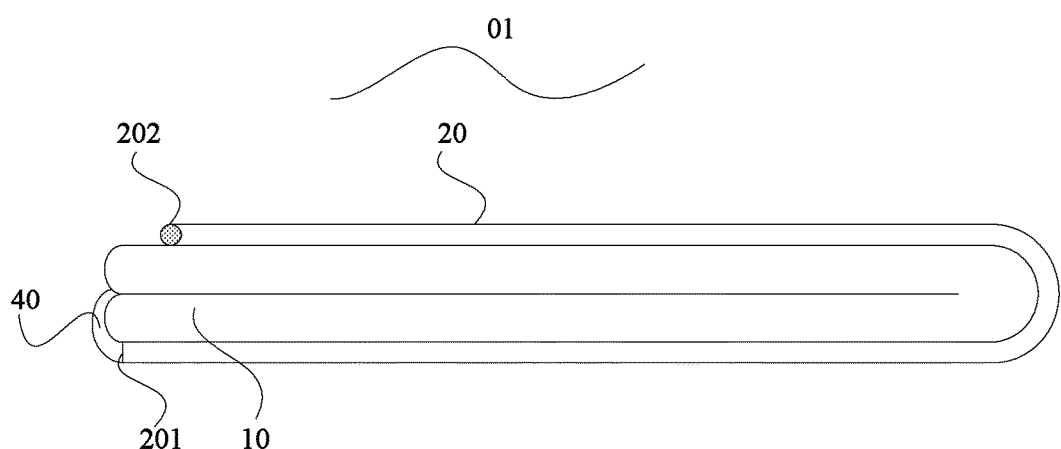
FIG. 4 is a second schematic structural view of a foldable display device in a folded state according to an embodiment of the present invention.

On one hand, as shown in FIG. 4, when the foldable display device 01 in the unfolded state is folded inward, by the stretching of the elastic member 40, the first end 201 of the flexible display screen 20 and the second end 202 thereof are located on the opposite sides of the foldable housing 10, so that full display is also possible when the foldable display device 01 is in the folded state.

Here, the second end 202 of the flexible display screen 20 comes out from the first fixing part 30 when the foldable display device 01 in the unfolded state is folded inward.

On the other hand, when the foldable display device 01 in the unfolded state is folded outward, the stretching of the flexible display screen 20 can be alleviated by the stretching of the elastic member 40, thus preventing the display screen 20 to be damaged; and the full display can also be performed when the foldable display device 01 is in the folded state.

Here, the second end 202 of the flexible display screen 20 is fixed by the first fixing part 30 when the foldable display device 01 in the unfolded state is folded outward.

Further optionally, the elastic member 40 may be a spring, or a connecting member having elasticity such as a rubber band.

By way of example, when the elastic member 40 is a spring, a cavity for holding the spring may be provided on the foldable housing 10, with one end of the spring connected to the first end 201 of the flexible display screen 20, and the other end thereof connected to the cavity, so that the spring can be hidden in the cavity when the foldable display device 01 is in the unfolded state, and the spring can be pulled out when the foldable display device 01 is folded. Here, the number of springs can be set according to the actual situation.

When the elastic member 40 is a rubber band, it may also be arranged in a manner similar to that described above, and will not be described in detail.

Optionally, the foldable display device 01 further comprises a second fixing part for fixing the second end 202 of the flexible display screen 20 after the foldable display device 01 is folded.

Thus, when the foldable display device 01 is folded inward, the flexible display screen 20 can be changed very well with the foldable housing 10 by the function of the second fixing part, so as to avoid the portions of the flexible display screen 20 other than the bent portion thereof to be bent, so that a good displaying effect is achieved when it displays.

Figure 5:
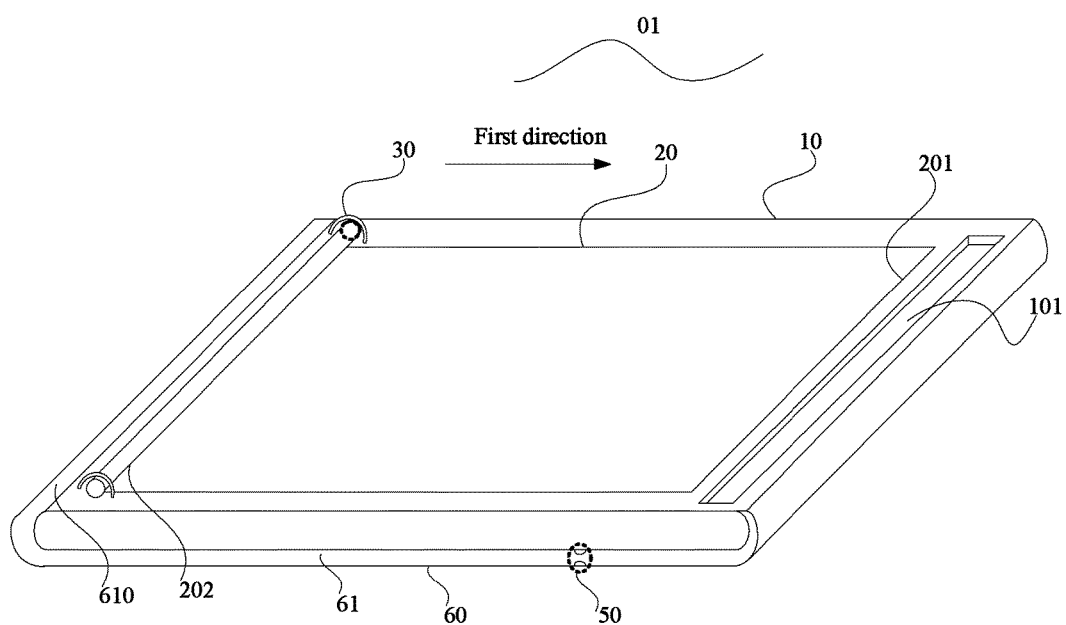
FIG. 5 is a second schematic structural view of a foldable display device in an unfolded state according to an embodiment of the present invention.
Figure 6:
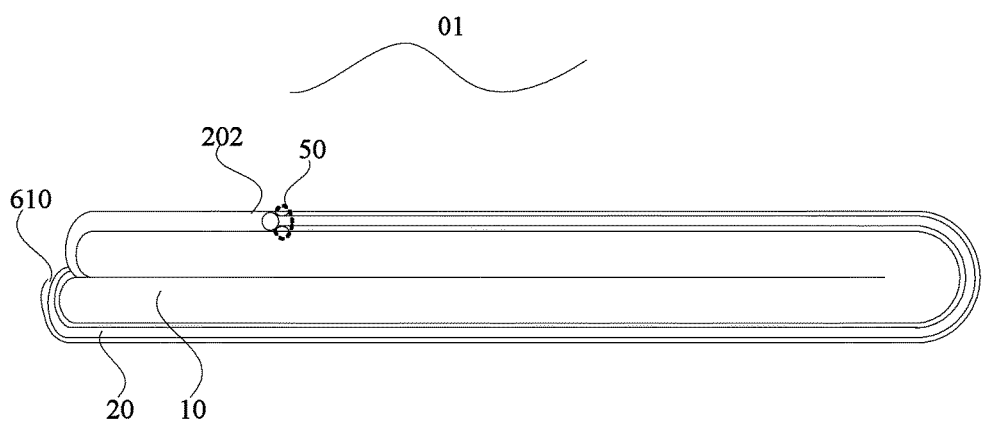
FIG. 6 is a schematic structural view of the foldable display device of FIG. 5 after folding of the foldable display device.

Further optionally, as shown in FIGS. 5 and 6, the foldable display device 01 further comprises a foldable outer frame 60, a cavity 61 that is configured to accommodate the flexible display screen 20 after the foldable display device 01 is folded, wherein the cavity 61 is disposed between the foldable outer frame 60 and the foldable housing 10, wherein the cavity 61 is disposed adjacent to the outer surface of the foldable housing 10 after folding of the foldable display device.

Here, since the flexible display screen 20 is to enter the cavity 61 when the foldable display device 01 is folded, the cavity 61 needs to have an opening 610 as shown in FIGS. 5 and 6.

Further, as shown in FIGS. 5 and 6, the second fixing part 50 is provided inside the cavity 61.

Figure 7:
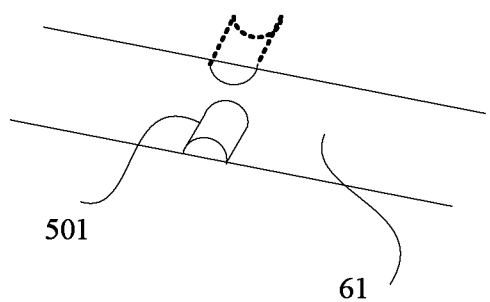
FIG. 7 is a schematic structural view of an elastic member according to an embodiment of the present invention.

Further, as shown in FIG. 7, the second fixing part 50 may be two elastic projections 501 disposed opposite to each other in the cavity 61.

It is to be noted that, first, the second fixing part 50 may be any structure other than the two elastic projections 501, as long as the second end 202 of the flexible display screen 20 can be fixed thereby.

Second, the second fixing part 50 is optionally provided at a position close to a position where the second end 202 of the flexible display screen 20 just arrives when the foldable display device 01 is in a folded state. The specific position can be set according to the actual situation, and is not limited here.

In the embodiment of the present invention, when the foldable display device 01 is folded, the second end 202 of the flexible display screen 20 may be manually assisted to enter the opening 610 of the cavity 61, and of course, if the opening 610 is large enough, the second end 202 of the flexible display screen 20 can also enter the opening 610 by the folding external force without manual assistance, and then, under the effect of the folding external force, the second end 202 of the flexible display screen 20 may continue to move along the cavity 610 and pass through the two oppositely disposed elastic projections 501 and the second end 202 of the flexible display screen 20 is secured on the other side of the elastic projections 501.

When the foldable display device 01 is unfolded, the second end 202 of the flexible display screen 20 can be pulled out from the two opposing elastic projections 501 due to the external force at the time of unfolding, and after that, the second end 202 of the flexible display screen 20 can continue to move along the cavity 610 and reach the first fixing part 30 through the opening 610 and is fixed by the first fixing part 30.

Based on the above, on one hand, the foldable outer frame 60 can function to protect the flexible display screen 20; on the one hand, when the material of the foldable outer frame 60 is provided as a transparent material, the foldable display device 01 can also display after being folded.

Optionally, referring to FIGS. 1 and 5, at least a side surface of the two side surfaces disposed opposite to each other in the first direction of the foldable housing 10 adjacent to the first fixing part 30 is an arcuate surface. That is, when the foldable housing 10 is in the unfolded state, at least the side surface of the two side surfaces disposed opposite to each other in the first direction of the foldable housing 10 adjacent to the first fixing part 30 is an arcuate surface.

Since when the foldable display device 01 in the unfolded state is folded inward, the flexible display screen 20 passes through the side of the foldable housing 10 near the first fixing part 30 and folds at the side, in this case, the arcuate surface may act as a support for the flexible display screen 20 and make the folded portion of the flexible display screen 20 also have a curvature, so that the curvature of the folded portion of the screen 20 will not be too small.

On the basis of this, by setting the other side surface also to be arcuate, the foldable housing 10 can have a nicer appearance.

Further optionally, the folded portion of the foldable housing 10 after folding of the foldable display device has an arcuate surface.

Thus, after the folding, the folded portion of the flexible display screen 20 can be curved with the arcuate surface so that the radius of curvature thereof cannot be too small.

Figure 8:
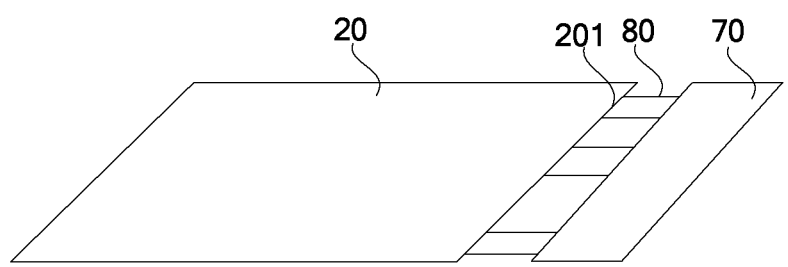
FIG. 8 is a schematic view showing a connection between a circuit board and a flexible display screen in a foldable display device according to an embodiment of the present invention.

Based on the above, as shown in FIG. 8, the foldable display device 01 further comprises a circuit board 70 disposed on the foldable housing 10 near the first end 201 of the flexible display screen 20.

Further, the circuit board is optionally connected to the flexible display screen 20 via a flexible connection line 80, such as an FPC (flexible circuit board).

In this way, if it is desired to perform full display after folding of the foldable display device 01, the length of the flexible connection line 80 may be set to be long. When the foldable display device 01 is unfolded, the flexible connection line 80 may be folded; and when the foldable display device is folded, the first end 201 of the flexible display screen 20 can be wound onto the opposite side of the foldable housing 10 with respect to the second end 202 of the flexible display screen 20 by the flexible connection line 80.

Based on the above, the flexible display screen in embodiments of the present invention may be a flexible display screen having a touch function, wherein the flexible display screen may be an OLED (organic light emitting diode) display screen, and of course, the OLED display screen can also be double-sided display, which may be set depending on the actual situation, and is not repeated here.

While specific embodiments of the invention have been described in detail, it should be understood that the invention is not limited to the disclosed embodiments, and that any variations and substitutions readily conceivable to those skilled in the art and within the technical scope disclosed by the invention are intended to be within the scope of the present invention. Accordingly, the scope of protection of the present invention should be determined by the scope of the claims.

This application claims the benefit of priority from Chinese patent application No. 201510359444.9 filed on Jun. 25, 2015, the disclosure of which is hereby incorporated by reference in its entirety as part of the present application.

The invention claimed is:

1. A foldable display device, comprising a foldable housing having a first surface and a second surface opposite the first surface, the foldable display device movable between an unfolded state, an inward folded state where opposite ends of the first surface are folded adjacent to one another, and an outward folded state where opposite ends of the second surface are folded adjacent to one another; and
a flexible display screen having a first end and a second end disposed opposite to each other in a first direction, wherein:
the first end of the flexible display screen is secured to the foldable housing;
the second end of the flexible display screen is removable with respect to the foldable housing;
the flexible display screen is in contact with the first surface of the foldable housing when the foldable display device is in the unfolded state;
the flexible display screen is located on the second surface of the foldable housing when the foldable display device is in the inward folded state, and the flexible display screen is located on the first surface of the foldable housing when the foldable display device is in the outward folded state; and
the flexible display device is movable to contact the second surface of the foldable housing when the foldable display device is moved from the unfolded state to the inward folded state.

2. The foldable display device according to claim 1, wherein the foldable housing includes a first fixing part for fixing the second end of the flexible display screen when the foldable display device is in the unfolded state.

3. The foldable display device of claim 1, wherein the first end of the flexible display screen is secured to the foldable housing by an elastic member.

4. The foldable display device according to claim 3, wherein the elastic member comprises a spring, or a rubber band.

5. The foldable display device according to claim 1, further comprising a second fixing part configured to fix the second end of the flexible display screen when the foldable display device is in the inward folded state.

6. The foldable display device of claim 5, further comprising a foldable outer frame, and a cavity configured to accommodate the flexible display screen when the foldable display device is in the inward folded state, wherein:
the cavity is disposed between the foldable outer frame and the foldable housing; and
the cavity is disposed adjacent to the second surface of the foldable housing when the foldable display device is in the inward folded state.

7. The foldable display device according to claim 6, wherein the second fixing part is positioned inside the cavity.

8. The foldable display device according to claim 7, wherein the second fixing part includes two elastic protrusions disposed opposite to each other in the cavity.

9. The foldable display device of claim 6, wherein the foldable outer frame includes a transparent material to allow the flexible display screen to display through the transparent material when the foldable display device is in the inward folded state.

10. The foldable display device according to claim 1, wherein the foldable housing includes two side surfaces disposed opposite to each other in the first direction, and at least one of the side surfaces adjacent to a first fixing part is an arcuate surface.

11. The foldable display device according to claim 10, wherein a folded portion of the foldable housing when the foldable display device is in the inward folded state has an arcuate surface.

12. The foldable display device according to claim 1, further comprising a first fixing part including two blocking portions and an opening and closing portion;

wherein one end of each blocking portion is connected to the foldable housing, another end thereof is connected to the opening and closing portion, and the opening and closing portion is movable with respect to the blocking portions.

13. The foldable display device of claim 1, comprising a circuit board disposed on the foldable housing adjacent to the first end of the flexible display screen.

* * * * *